_US005614744A_

United States Patent [19]
Merrill

[11] Patent Number: 5,614,744
[45] Date of Patent: Mar. 25, 1997

[54] CMOS-BASED, LOW LEAKAGE ACTIVE PIXEL ARRAY WITH ANTI-BLOOMING ISOLATION

[75] Inventor: Richard B. Merrill, Daly City, Calif.

[73] Assignee: National Semiconductor Corporation, Santa Clara, Calif.

[21] Appl. No.: 511,609

[22] Filed: Aug. 4, 1995

[51] Int. Cl.[6] .................................................. H01L 31/062
[52] U.S. Cl. .......................... 257/291; 257/292; 257/369; 257/373; 257/376; 257/446; 257/544; 257/546; 257/547
[58] Field of Search ..................... 257/291, 292, 257/446, 544, 546, 547, 369, 373, 376

[56] References Cited

PUBLICATIONS

Fumihiko Andon et al., "A 250,000–Pixel Image Sensor with FET Amplification at Each Pixel for High–Speed Television Cameras", IEEE International Solid State Circuits Conference, Feb. 16, 1990, pp. 212–213.

Primary Examiner—Edward Wojciechowicz
Attorney, Agent, or Firm—Limbach & Limbach L.L.P.

[57] ABSTRACT

An active pixel image sensor in accordance with the present invention utilizes guard rings, protective diffusions, and/or a combination of these two techniques to prevent electrons generated at the periphery of the active area from impacting upon the image sensor array. For example, an n+ guard ring connected to $V_{cc}$ can be imposed in the p-epi layer between the active area edge and the array, making it difficult for edge-generated electrons to penetrate the p+ epi in the array; this approach requires the use of annular MOS devices in the array. Alternatively, the gates of the n-channel devices in the array can be built to overlap heavily doped p+ bands, forcing current flow between the source/drain regions. As stated above, combinations of these two techniques are also contemplated. Elimination of the active area edge leakage component from the array can increase the dynamic range of the image sensor by 6 bits.

4 Claims, 5 Drawing Sheets

|  | VR = 5V | |
|---|---|---|
|  | AREA (A/um2) | PERI (A/um) |
| 25C | 1.6E-18 | 1.6E-16 |
| 85C | 2.2E-16 | 7.6E-15 |
| 150C | 6.7E-14 | 3.3E-13 |

|  | VR = 10V | |
|---|---|---|
|  | AREA (A/um2) | PERI (A/um) |
| 25C | 8.1E-18 | 7.8E-16 |
| 85C | 4.5E-16 | 3.3E-14 |
| 150C | 1.0E-13 | 6.3E-13 |

CMOS-BASED, LOW LEAKAGE ACTIVE PIXEL ARRAY WITH ANTI-BLOOMING ISOLATION

BACKGROUND OF THE INVENTION

1. Field of the Invention

The present invention relates to imaging devices and, in particular, to a CMOS active pixel image sensor cell design that substantially reduces photosensor leakage. An n-isolation layer formed under the pixels reduces cross-talk to simplify integration with digital logic and to reduce blooming.

2. Discussion of the Related Art

In order to meet the increasing need for high speed, "smart" image sensor devices, it is becoming necessary to integrate the image sensor array with other digital circuitry that controls the operation of the array and processes the array output. Integration of the image sensors with complimentary-metal-oxide-semiconductor (CMOS) support circuitry would be most desirable because of the low power consumption characteristics, maturity and common availability of CMOS technology.

Charge coupled devices (CCDs) are currently the most widely used technology for image sensors. However, CCDs are very power intensive and, due to their inherent sequential read out, have inefficient charge transfer characteristics unsuited for many high fidelity imaging applications. Furthermore, CCDs are not easily integrated with CMOS circuits due to complex fabrication requirements and high cost.

U.S. Pat. No. 5,289,023, issued to Carver A. Mead on Feb. 22, 1994, discloses an active pixel image sensor technology based upon a single npn poly-emitter bipolar phototransistor that is used both as an integrating photosensor and a select device. The Mead imager exhibits high sensitivity at low light levels, operates over a wider dynamic range than can be achieved with CCDs, and, because of its single-transistor photosensor, requires a relatively small cell array area. While the Mead technology offers great promise for the future, it has some drawbacks such as difficulty in obtaining good beta matching in the poly-emitter bipolar devices, the typical problems associated with fabricating buried layers and the high leakage sensitivity of the array.

S. K. Mendes. et al., "Progress In CMOS Active Pixel Image Sensors," SPIE, Vol. 2172, pp. 19–29, describe an active pixel sensor technology that is inherently CMOS compatible. Referring to the FIG. 1A schematic and the FIG. 1B timing diagram of the Mendes et al. publication, the imaging structure consists of a photogate PG with a floating diffusion output node FD separated by a transfer gate TX. The pixel unit cell also contains a reset transistor R, the input transistor of a first source-follower and a row selection transistor X. The read out circuit, which is common to an entire column of pixels, includes a load transistor VLN of the first source-follower and two sample and hold circuits for storing the signal level and the reset level. Each sample and hold circuit consists of a sample and hold switch (SHS or SHR) and capacitor (CS or CR) and a second source-follower and column selection transistor (Y1 or Y2). The load transistors of the second set of source-followers (VLP1 and VLP2) are common to the entire array of pixels.

In the operation of the FIG. 1A circuit, the rail voltages are set at 5 V and 0 V and the transfer gate TX is biased at 2.5 V. During signal integration, photogenerated electrons are collected under the photogate PG which is biased at 5 volts. The reset transistor R is biased at 2.5 V to act as a lateral anti-blooming drain, allowing excess charge to flow to the reset drain. The row-selection transistor X is biased off at 0 V. Following signal integration, the pixels of an entire row are read out simultaneously. First, the pixels in the row to be read out are addressed by enabling row selection switch X. Then, the floating diffusion output node FD of the pixel is reset by briefly pulsing the reset gate R to 5 V. This resets the floating diffusion output node FD to approximately 3.5 V. The output of the first source-follower is sampled onto capacitor CR at the bottom of the column by enabling sample and hold switch SHR. Then. photogate PG is pulsed low to 0 V, transferring the signal charge to the floating diffusion output node FD. The new output voltage is sampled onto capacitor CS by enabling sample and hold switch SHS. The stored reset and signal levels are sequentially scanned out through the second set of source-followers by enabling column address switches Y1 and Y2. The timing sequence for this operation is shown in FIG. 1B.

One of the biggest issues to be addressed when integrating an imaging array into a CMOS process is junction leakage on the photocollector. FIG. 2 shows photocollector junction leakage data for a conventional CMOS process. Note that the periphery component of the junction leakage is 100× the area component for $V_R$=5 V at room temperature (T=25° C.). This is because the active area edge is a region of high interface state density and, furthermore, is a region of high stress which acts as a gettering site for defects. Typically this peripheral leakage limits the dynamic range of the output of a CMOS active pixel sensor to about 8 bits. While suitable for some applications, 8-bit dynamic range does not affect the image quality required in other cases. For example, production of an image having 35 mm photographic quality requires about 10-bit dynamic range.

Furthermore, the motivation for building an imaging array utilizing a CMOS process is to allow integration with an analog to digital converter (ADC), thereby facilitating a digital-out imaging product. However, cross-talk between the digital CMOS circuitry of the ADC and the image array is a concern.

SUMMARY OF THE INVENTION

The present invention provides a CMOS active pixel image array that does not include an active area edge, thereby reducing junction leakage by 100× and, therefore, increasing the dynamic range of the array by about 6 bits. Also, an "N-iso" layer placed under the pixel array minimizes cross-talk and provides substantial blooming suppression.

Thus, an active pixel image sensor in accordance with the present invention utilizes guard rings, protective diffusions, and/or a combination of these two techniques to prevent electrons generated at the periphery of the active area from impacting upon the image sensor array. For example, an n+ guard ring connected to $V_{cc}$ can be imposed in the p-epi layer between the active area edge and the array, making it difficult for edge-generated electrons to penetrate the p+ epi in the array; this approach requires the use of annular MOS devices in the array. Alternatively, the gates of the n-channel devices in the array can be built to overlap heavily doped p+ bands, forcing current flow between the source/drain regions. As stated above, combinations of these two techniques are also contemplated. Elimination of the active area edge leakage component from the array can increase the dynamic range of the image sensor by 6 bits.

Other features and advantages of the present invention will become apparent and be appreciated by reference to the

DETAILED DESCRIPTION OF THE INVENTION

Figure 3:
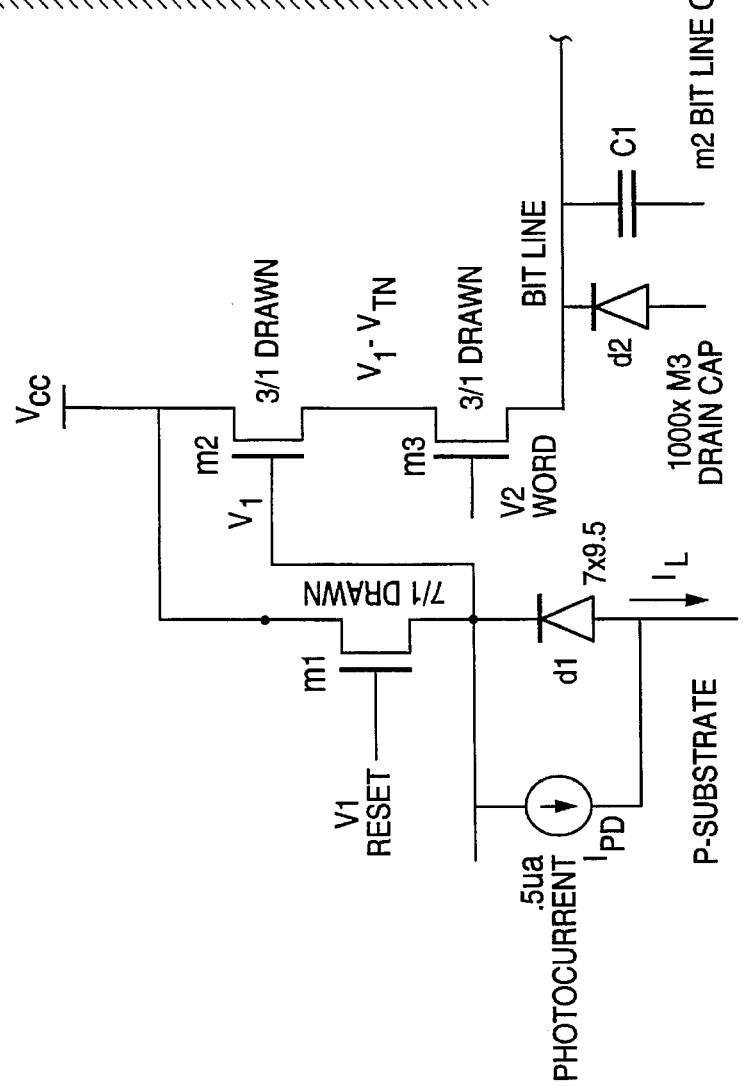
FIG. 3 is a schematic diagram illustrating a low leakage CMOS active pixel image cell utilizable in accordance with the present invention.

FIG. 3 shows a low leakage CMOS active pixel image sensor cell 10 in accordance with the present invention. The pixel unit cell 10 includes a photodiode d1 and a floating diffusion output node 12 at the source of a reset transistor m1. The pixel unit cell 10 also includes a source-follower transistor m2 and a row selection transistor m3. Those skilled in the art will appreciate that the pixel cell 10 can be included in a row/column array of cells such as that described in the Mendes, et al. publication. Reset transistor m1 resets the photodiode d1 to $V_{cc}$–VTN. Source-follower transistor m2 buffers the voltage on the photodiode d1 out onto the bit line for the column of array pixel cells that includes cell 10. Row selection transistor m3 selects which row of cells in the array is to be read. The FIG. 3 circuit shows capacitor C1 and diode d2 to emulate the parasitic bit line capacitance.

Figure 2A:
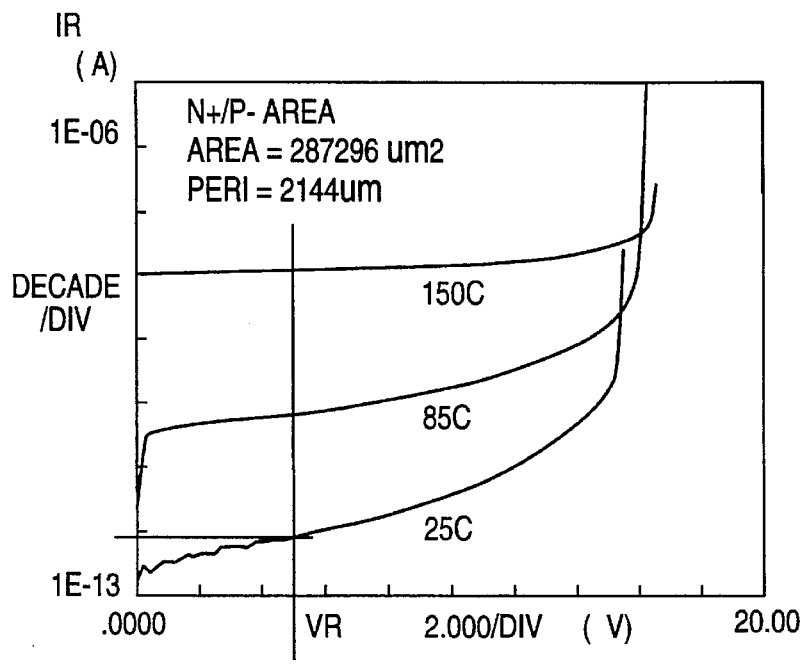
FIGS. 2A and 2B are graphs illustrating junction leakage in a conventional CMOS active pixel image sensor at read voltages of 5 V and 10 V, respectively.
Figure 2B:
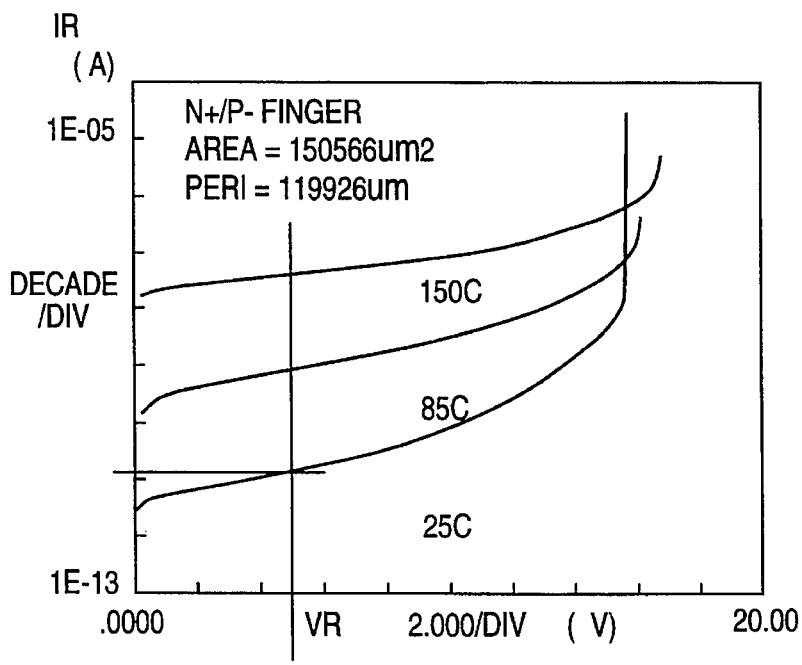

As discussed above with respect to FIGS. 2A and 2B, photosensor current leakage $I_L$ has a significant effect on the dynamic range of the imaging device, with the active area perimeter contributing 100 times the current leakage as compared with the array area for conventional CMOS designs (at 25° C. and $V_R$=5 V). Typically, the total current leakage $I_L$ divided by imaging photocurrent $I_{PD}$ is $$\frac{I_L}{I_{PD}} = \frac{1}{1000}$$

thereby limiting the dynamic range of the device about 10 bits ($2^{10} \approx 1000$).

Since the perimeter contributes X100 more to current leakage $I_L$ than does the array area, elimination of the active area edge in the array can increase the dynamic range by about 6 bits ($2^6 \approx 100$).

Figure 4:
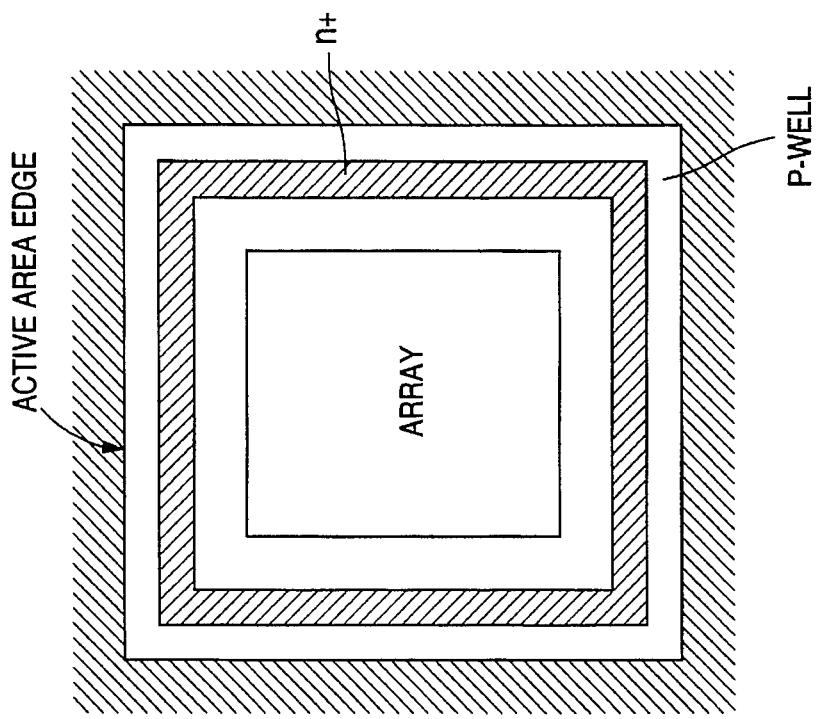
FIG. 4 is a layout illustrating an n+ guard ring isolating an active pixel image array from an active area edge.

FIG. 4 shows one mechanism for eliminating the contribution of the active area edge to the leakage current $I_L$. In the FIG. 4 embodiment of the invention, an n+ guard ring biased to $V_{cc}$ is formed in the p-well to surround the entire pixel array, thereby preventing electron formed at the active area edge from penetrating the array.

Since the use of a surrounding n+ guard ring eliminates the field oxide for use in forming the pixel cells of the array, other mechanisms must be provided to direct current flow in the npn devices utilized in the individual cells.

One such mechanism is the use of annular transistors.

Figure 5:
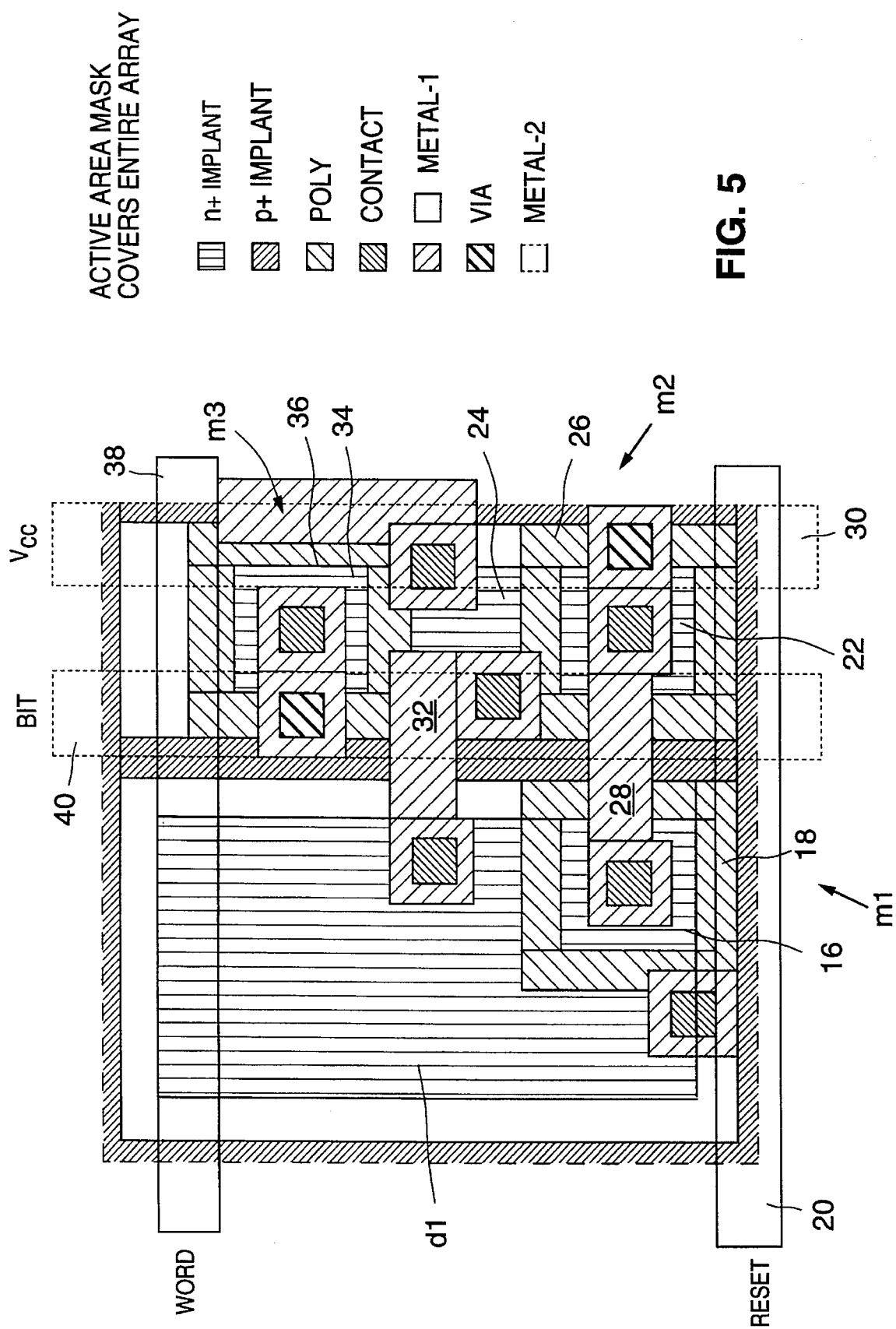
FIG. 5 is a layout illustrating the FIG. 3 low leakage cell.

FIG. 5 shows the layout of the FIG. 3 cell utilizing annual transistor M1, M2 and M3. As shown in FIG. 5, there is no composite edge anywhere in the core cell 10. The N+/P− photodiode is on the left and isolated from other photodiodes and transistors by P+ diffusion formed using the P-mask on gate oxide silicon screening the bare silicon (N+ area is formed the same way). Transistors m1, m2 and m3 are necessarily annular to avoid source/drain leakage without any field oxide edge to overlap the end of the gates. Transistors m2 and m3 are isolated by their own p+ guard ring.

Figure 1B:
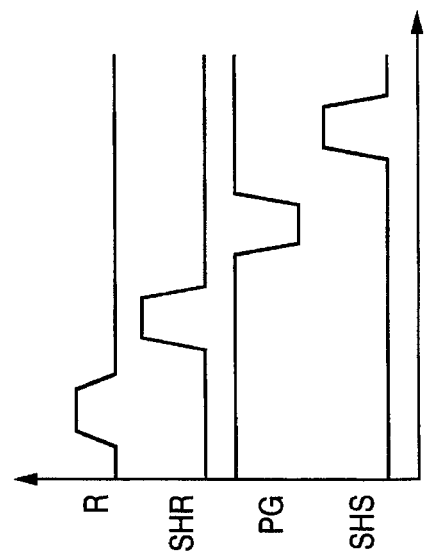
FIG. 1B is a timing diagram illustrating a read out operation of the FIG. 1A pixel unit cell.
Figure 1A:
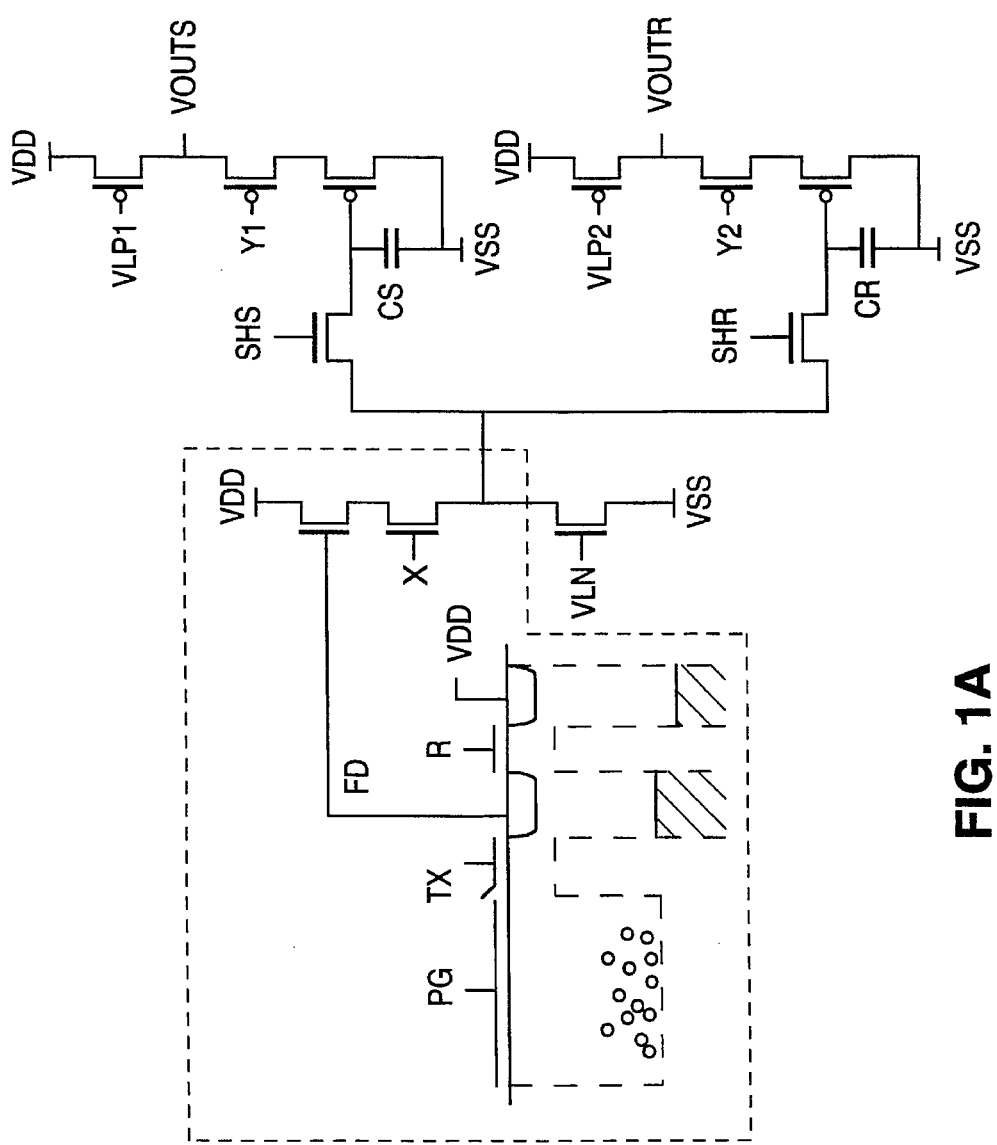
FIG. 1A is a schematic drawing illustrating a pixel unit cell of a conventional CMOS active pixel image sensor.

More specifically, FIG. 1 shows photodiode d1 formed in p+ semiconductor material and annular n-channel transistors m1, m2 and m3. Reset transistor m1 includes a drain region 16 that is spaced-apart from the n+ photodiode region d1. The annular polysilicon gate 18 of the reset transistor overlies the intervening channel region between the drain region 16 and the photodiode region d1. The gate 18 of the reset transistor m1 is connected to a reset line 20. Source-follower transistor m2 includes a source region 22 formed in spaced-apart relationship to the drain region 16 of the reset transistor M1. An intermediate n-type region 24 is formed in spaced-apart relationship to the source region 22. A second annular polysilicon gate 26 overlies the intervening p-channel section between the source region 22 and the intermediate region (drain) 24. The source region 22 of the source-follower transistor m2 is connected to the drain region 16 of the reset transistor m1 via metal-1 line 28 and the Vcc power line 30. The gate 26 of the source-follower transistor m2 is connected to the photocollector region d1 via metal-1 line 32. Row select transistor m3 includes a n-type drain region 34 that is also spaced-apart from the intermediate region 24. A third annular polysilicon region 36 provides the gate of the row select transistor m3. The gate 36 at the row select transistor m3 is connected to word line 38; the drain region 34 is connected to the bit line 40.

Figure 6:
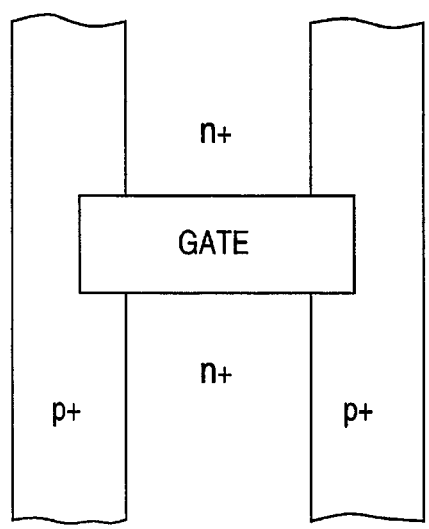
FIG. 6 is another mechanism utilizing P+ implants in the individual cells.

FIG. 6 shows another mechanism that can be utilized to form n-channel transistors m1, m2 and m3 at the individual pixel cells of the imaging array without utilizing the active area edge. This mechanism utilize p+ implants in the individual cells to avoid source/drain leakage.

Of course, those skilled in the art will appreciate that combinations of guard ring structures and p+ implants can be utilized in the layout of both the array and the individual pixel elements to eliminate the impact of photosensor current leakage due to the active area edge.

Figure 7:
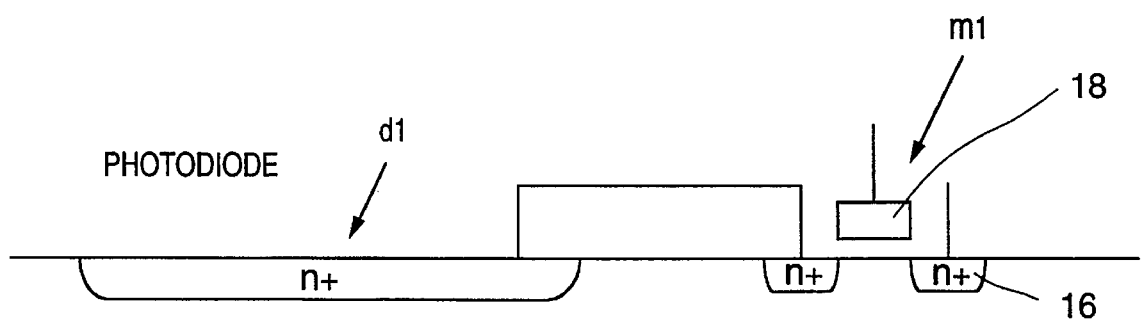
FIG. 7 is a cross-sectional view illustrating the FIG. 3 low leakage cell with N-iso isolation.

FIG. 7 shows a cross-section view of the photodiode d1 and reset transistor m1 of the FIG. 3 cell with N-type isolation present. N-iso region 50 is formed on p-type semiconductor substrate 52. P-well 54 is formed in N-iso region 50. The N-type isolation region 50 helps prevents crosstalk from the noisy CMOS sections of the die and also reduces blooming by collecting excess electrons during overexposure conditions. Those skilled in the art will appreciate that the N-iso region 50 can be formed in the course of implementing any conventional core CMOS process flow. In operation, the N-iso region 50 is biased to +5 V.

It should be understood that various alternatives to the embodiments of the invention described herein may be employed in practicing the invention. It is intended that the following claims define the scope of the invention and that methods and structures within the scope of these claims and their equivalents be covered thereby.

What is claimed is:

1. An active pixel image sensor cell comprising:

an isolation region of n-type conductivity formed on semiconductor material of p-type conductivity;

a well region of p-type conductivity formed in the n-type isolation region;

leakage protection means formed in the p-type well region for substantially eliminating current leakage in the cell due to active area edge effects;

a photocollector device that includes a region of n-type conductivity formed in the p-type well region;

a reset transistor that includes first spaced-apart source and drain regions of n-type conductivity formed in the p-type well region to define a first p-type channel region therebetween, and a first conductive gate formed over said first p-type channel region and separated therefrom by dielectric material, said first conductive gate connected to receive a reset signal, and wherein the photocollector region and the first source region being connected to a floating diffusion output node, the first drain region being connected to a positive supply voltage;

a source-follower transistor that includes second spaced-apart source and drain regions of n-type conductivity formed in the p-type well region to define a second p-type channel region therebetween, and a second conductive gate formed over said second channel region and separated therefrom by dielectric material, said second conductive gate being connected to the floating diffusion output node, said second source region being connected to the positive supply voltage; and a row select transistor that includes third spaced-apart source and drain regions of n-type conductivity formed in the p-type well region to define a third p-type channel region therebetween and a third conductive floating gate formed over said third channel region and separated therefrom by dielectric material, said third conductive gate being connected to a word line to receive a row select signal applied to said word line, said third drain to region being connected to the second source region of the source-follower transistor, said third source region being connected to a conductive bit line.

2. An active pixel image sensor cell as in claim 1 and wherein the photocollector device comprises a photodiode.

3. An active pixel image sensor cell as in claim 1 and wherein the photocollector device comprises a phototransistor that includes said n-type photocollector region for collecting photogenerated electrons, a conductive photogate formed over the photocollector region and separated therefrom by dielectric material, the photogate being connected to receive a pulsed drive signal, the photocollector region being spaced-apart from the first source region of the reset transistor to define a region of p-type conductivity therebetween, a conductive transfer gate being disposed over said region of p-type conductivity and separated therefrom by dielectric material such that the photocollector region is electrically connected to said first source region by applying a transfer voltage to said transfer gate.

4. An active pixel image sensor cell structure comprising:

a region of p-type conductivity semiconductor material;

a photocollector region of n-type conductivity formed in the p-type region;

a reset transistor that includes a first drain region of n-type conductivity formed in the p-type region and spaced-apart from the n-type photocollector region to define a first intervening section of said p-type region therebetween, and a first annular conductive gate region having a portion thereof formed over the first intervening section of said p-type region and separated therefrom by dielectric material, said first annular conductive gate region being formed to surround said first n-type drain region and connected to a reset line to receive a reset signal;

an annular source-follower transistor that includes a source region of n-type conductivity formed in the p-type region in spaced-apart relationship to the first drain region of the reset transistor, and an intermediate region of n-type conductivity formed in the p-type region in spaced-apart relationship to said source region to define a second intervening section of said p-type region therebetween, and a second annular conductive gate region having a portion thereof formed over the second intervening section of said p-type region and separated therefrom by dielectric material, said second annular conductive gate region being formed to surround said source region, said source region being electrically connected to said first drain region and to a positive supply voltage source;

a row select transistor that includes a third drain region of n-type conductivity formed in the p-type region in spaced-apart relationship to the intermediate n-type region to define a third intervening section of said p-type region therebetween, and a third annular conductive gate having a portion thereof formed over the third intervening section and separated therefrom by dielectric material, said third annular conductive gate being formed to surround said third drain region and connected to a word line to receive a row select signal from said word line, the third drain region being connected to a bit line; and an n+ guard ring form in the p-type region to surround the active pixel image sensor cell.

* * * * *